(12) United States Patent
Hofstetter et al.

(10) Patent No.: US 6,288,553 B1
(45) Date of Patent: Sep. 11, 2001

(54) METHOD FOR DETERMINING THE LOOP RESISTANCE OF A POWER SUPPLY NETWORK

(75) Inventors: Christoph Hofstetter, Herbolzheim-Wagenstadt; Frank Henninger, Freiburg, both of (DE)

(73) Assignee: Ch. Beha GmbH Technische Neuentwicklungen, Glottertal (DE)

( * ) Notice: Subject to any disclaimer, the term of this patent is extended or adjusted under 35 U.S.C. 154(b) by 0 days.

(21) Appl. No.: 09/172,025

(22) Filed: Oct. 14, 1998

(30) Foreign Application Priority Data

Oct. 18, 1997 (DE) .............................................. 197 46 200

(51) Int. Cl.$^7$ .................................................. G01R 31/08
(52) U.S. Cl. ........................................... 324/525; 324/718
(58) Field of Search ..................................... 324/771, 710, 324/725, 718, 522, 523, 525, 533, 537

(56) References Cited

U.S. PATENT DOCUMENTS 5,825,189 * 10/1998 Johns ................................... 324/525

FOREIGN PATENT DOCUMENTS

| 274 681 A1 | 12/1989 | (DD) . |
|---|---|---|
| 274681 | 12/1989 | (DD) . |
| 1237218 | 3/1967 | (DE) . |
| 1 257 960 | 1/1968 | (DE) . |
| 1 287 211 | 1/1969 | (DE) . |
| 2 035 274 | 11/1971 | (DE) . |
| 40 13 490 A1 | 10/1991 | (DE) . |
| 4013490 | 10/1991 | (DE) . |
| 0 295 800 A2 | 12/1988 | (EP) . |
| 0 295 800 B1 | 12/1988 | (EP) . |
| 95/01573 | 1/1995 | (WO) . |

* cited by examiner

Primary Examiner—Safet Metjahic
Assistant Examiner—Etienne P LeRoux
(74) Attorney, Agent, or Firm—Nath & Associates PLLC; Gary M. Nath; Marvin C. Berkowitz

(57) ABSTRACT

The invention relates to a method for determining the loop resistance of a power supply network with a neutral conductor (called N), a phase or external conductor (called L1), a ground or protective earth conductor (called PE), and a fault current breaker (called FI) based on the differential quotient $$Ri = dU/dI \approx (U1-U2)/(I1-I2);$$

whereby U1 is the measured, unloaded network voltage, I1 is the zero current without load, U2 is the measured, loaded network voltage, and I2 is the calculated load current. According to one aspect of the invention, the following steps are provided: Loading of a L1-N loop and determining the resistance $R_{L1}$ according to equation (1), loading of a N-PE loop with a measuring current $I_M$ under a measuring voltage $U_M$ which is small enough to avoid triggering of the fault current circuit breaker, and determining the resistance $R_{PE}$ according to the following equation (2):

$$R_{PE} = U_M/I_M \qquad (2)$$

and determining the loop resistance as $R_{L1} + R_{PE}$.

14 Claims, 1 Drawing Sheet

METHOD FOR DETERMINING THE LOOP RESISTANCE OF A POWER SUPPLY NETWORK

FIELD OF THE INVENTION

The invention relates to a process for determining the loop resistance of a power supply network of the type having a neutral conductor (N), an external conductor (L1), a protective earth conductor (PE), and a fault current circuit breaker (FI).

BACKGROUND OF THE INVENTION

Such a method is known, for example, from EP 0 925800 B1. In that document, a magnetically coupled sensor circuit is used in an alternating current circuit for temporarily switching off a residual current circuit breaker. In this method, a direct current source is connected to the circuit protected by the residual current circuit breaker. Furthermore, a direct saturation current is supplied from the direct current source into the circuit protected by the residual current circuit breaker in order to magnetically saturate the sensor circuit of the residual circuit breaker and in this way interrupt the residual current circuit breaker so that it is temporarily out of operation and in this way permits a test in the circuit.

Other methods for determining the loop resistance of a power supply network are known from documents DE-AS 20 35 274, DE 40 13 490 A1 and DD 274 681 A1.

Loop resistance measurements are used to make statements about the resistance values occurring in the network. The loop resistance is determined by the external conductor or phase, hereon called L1 conductor, and the ground or protective earth conductor, hereon also called PE conductor. Resistance values that are too high may prevent the triggering of the fault current circuit breaker, hereon called FI, that is provided in the power supply network, and thus may pose a danger to humans and animals. As a result of a too high loop resistance and the current flowing in the fault case, high voltages may be released from the network lines in a fault case and may expose the equipment cases or the body of humans or animals to a dangerous contact voltage. In particular in critical facilities, such as hospitals, the contact voltage must not exceed 25 V.

When discussing the loop resistance, two common network forms must be differentiated, the so-called TN network and the so-called TT network.

In the TN network, the star point of the generator is directly grounded. The connected devices are connected with the star point via the protective earth conductor. The connection is made via the so-called PEN conductor related to the TN-C network; i.e., together, via the neutral and protective earth conductor or via a separate neutral conductor N and the protective earth conductor PE (in the so-called TN-S network). Often, a combination of both networks exists. In this case, it is called a TN-C-S network. By building the network, a body contact always becomes a short circuit. The fault current is therefore relatively high, and in many cases fuses or circuit breakers can be used as protective devices for switching off a faulty device. These other protective measures are generally described by using the term grounding. In the case of such networks, it can be assumed that the loop resistance is very small and is essentially determined by the internal resistance of the network. The loop resistance is obtained from the resistance of the L1 conductor and the PE conductor as well as the PEN conductor.

The loop resistance of the real TN network is in particular composed of the generator internal resistance, the internal resistances of the transformers, the line resistances of the high voltage-low voltage conductors, and the transition and line resistances of the electric installation of the final consumer or inside a building.

A value of 2 Ohms is considered sufficient for the total grounding resistance of all system earths. This makes it possible that in the case of a ground fault of an external conductor, the voltage of the protective earth PE or of the PEN conductor do not have unacceptably high values in relation to the earth potential. In the case of floors with low conductivity, the entire earth resistance of the supply network may have a value of up to 5 Ohms if it can be assumed that in the case of a ground fault in an external conductor the earth transition resistance also has a correspondingly high value.

In the TT network, the start point of the generator is also directly grounded. The devices connected to the network are connected to ground connections that are independent from the grounding of the generator. When the network is built, a body contact becomes a ground fault. In the case of poor grounding, this may lead to high loop resistances, which may make a fault current circuit breaker ineffective. Especially in such a case, a loop resistance meter or a process for operating such a system would be reasonable, since they would allow a calculation of the maximum current flowing in case of a ground fault. From this, it could be deduced whether a preceding fault current circuit breaker or fuse would be triggered when the contact voltage is kept. By determining the loop resistance, a statement can be made about the quality of the network, and in particular about the respective grounding conditions. If the ground resistance is supposed to be analyzed in more detail, a special ground meter is necessary. The loop resistance is composed of the resistance of the L1 conductor and of the PE conductor as well as the ground resistance.

The loop resistance of the real TT network is composed of the generator internal resistance, the internal resistance of the transformers, the line resistances of the high-voltage and low-voltage conductors, the transition and line resistances of the electric installation at the consumer or in the building, and the resistance of the earth.

The previously addressed fault current circuit breaker is responsible for switching off all poles of operated devices within 0.2 seconds if, due to an isolation fault, a dangerous contact voltage occurs. Since the actual switch-off times of such circuit breakers are significantly shorter, fault current circuit breakers offer an especially effective protection.

The acceptable maximum values for the grounding resistance in the TT network depend on the acceptable contact voltage and the nominal fault current of the fault current circuit breaker. Depending on the grounding condition, this resistance may be high. In the TN network, the switching-off is always ensured by the low impedance. Since human protection is safely ensured with fault current circuit breakers, they are increasingly used in both of the previously mentioned networks.

All conductors (conductors L1, L2, L3 and N) leading from the network to the protected devices are passed through the cumulative current transformer. Since in a fault-free state the sum of the currents flowing in and out is zero, the magnetic alternating fields of the conductors cancel each other. In this case, no voltage is induced in the output winding of the cumulative current transformer.

In the case of a ground fault of a conductor, or in the case of a body contact of an operated device, a partial current flows via the earth to the current generator and back. Because of this, the sum of the input and output currents is no longer zero. For this reason, a voltage that actuates an electromagnetic trigger is induced in the output winding of the cumulative current transformer. This trigger switches all poles of the network. A fault can be simulated with a test key. This makes it possible to test the trigger function of the FI circuit breaker, but not the grounding of the system to be protected.

The switch-off time of a fault current circuit breaker must not exceed 200 ms, if—in the case of alternating fault currents—the nominal fault current, and—in the case of pulsating direct fault currents—the 1.4-fold nominal fault current is flowing. If these currents are exceeded by a factor of 5, fault current circuit breakers must reliably switch off within 40 ms. As a result, the measurement of the loop resistance must take place within a short time if high test voltages are used.

Known methods for determining the loop resistance of a power supply network of the initially mentioned type in which the internal resistance is determined according to the differential quotient of voltages and currents provide for energizing the loop of L1 conductor and PE conductor with a current load. As a result, the existing fault current circuit breaker is triggered by the fault current generated in the PE conductor. Previously known measuring methods and instruments load the L1-PE loop with an approximately 10 A peak current during a half-wave. This current regularly causes the triggering of the fault current circuit breaker.

SUMMARY OF THE INVENTION

In view of this state of the art, the objective of the invention is to create a method for determining the loop resistance of a power supply network of the type having a neutral conductor (N), an external conductor (L1), a protective earth conductor (PE), and a fault current circuit breaker (FI), which operates reliably to the effect that a fault current circuit breaker is not triggered due to the network load or a corresponding measuring current.

This objective is realized by the characterizing features of the method as claimed in the independent claims. Advantageous further developments of the invention are provided in the sub-claims.

According to the suggested solutions of the independent claims, unlike the state of the art, the LI-PE loop is not loaded with a peak measuring current, but instead the LI-N loop is. In a first preferred embodiment, the LI-PE loop is energized in addition to the LI-N loop, i.e., with a measuring current that is small enough to prevent the triggering of the fault current circuit breaker. In contrast to this, the LI-N loop can receive a load as high as desired without triggering the fault current circuit breaker.

According to a second preferred embodiment, according to which the L1-PE loop is also loaded, a cosinus voltage is derived additionally from the network sinus voltage, and the peak load value for the network voltage is determined by simultaneous sensing of the cosinus voltage and the sinus voltage in the load interval, but without loading the entire half-wave. In other words, a triggering of the fault current circuit breaker is avoided, since a loading takes place exclusively in inside a close time interval of the half-wave, i.e., preferably starting from a cross-over of the sinus voltage.

BRIEF DESCRIPTION OF THE DRAWINGS

The invention is explained in more detail below in reference to the drawings, in which.

DETAILED DESCRIPTION

The following findings are basis for the variants of the method according to the invention explained below:

The test current flowing in the PE conductor may not exceed a mean value of 5 mA. At this value, even the most sensitive fault current circuit breakers certainly are not triggered. If a mean current of 5 mA is used, the measurement also may extend over a relatively long period.

If the time window in which the current flows is reduced, higher test currents may also be input. With the help of measurements it was found that a test current of 1 A over a period of 100 $\mu$s still does not trigger a fault current circuit breaker with a 30 mA nominal fault current.

The voltage differential between the loaded and the unloaded are measured after two consecutive phases of the network voltage. This reduces the influence of the voltage fluctuations which may occur in the network, so that the measurements are always taken at identical phase angles.

Since low-resistance networks may have loop resistance values <1 Ohm, the voltage differential to be expected for a current of 1 Ampere is smaller than 1 Volt. It is therefore reasonable to perform voltage measurements at phase angles at which the network voltage has small values. The dynamics scope of the corresponding measuring circuit may therefore be small.

Figure 1:
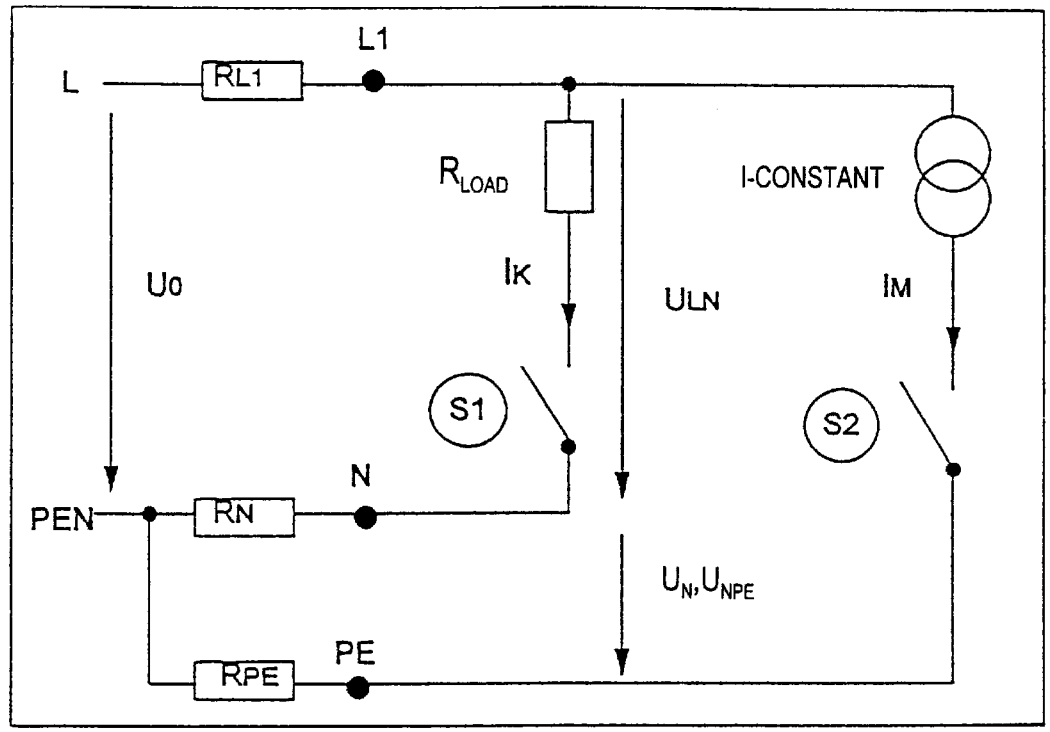
FIG. 1 shows a switching diagram clarifying the first variant of the method according to the invention.

FIG. 1 shows a substitute switching diagram for the power supply network in question. This substitute switching diagram shows that $R_{PE}$ can be determined indirectly via the resistance of the N conductor $R_N$ if a current is fed into the PE conductor and the resulting voltage differential $U_{NPE}$ is measured.

A first step is to determine the resistance $R_L$ of the L conductor. The network no-load voltage $U_0$ is measured with the switch S1 open. The network is then loaded between L and PEN by closing the switch S1. In the process, large currents may be used, since the load is applied between L1 and N.

Through the voltage drop $U_{LN}$ at the load resistance $R_{Load}$ and the voltage $U_{NPE}$, RL1 is calculated indirectly as follows:

$I_k = U_{LN}/R_{load}$; $I_K = U_0/(R_{L1}+R_N+R_{load})$ $RN = \Delta U_N/I_K$ $\Delta U_N = U_{NPE}$ (measured with S1 closed)$-U_{NPE}$ (measured with S1 open)

$U_{LN}/R_{load} \cdot (R_{L1}+R_N+R_{load}) = U_0$ $R_{L1}+R_N+R_{load} = U_0/U_{LN} \cdot R_{load}$ $R_{L1} = U_0/U_{LN} \cdot R_{load} - R_N - R_{load}$; $R_N = \Delta U_N/I_K$;

$I_K = U_{LN}/R_{load}$ $R_{L1} = U_0/U_{LN} \cdot R_{load} - \Delta U_N/U_{LN} \cdot R_{load} - U_{LN}/U_{LN} \cdot R_{load}$ $R_{L1} = (U_0 \cdot R_{load} - \Delta U_N \cdot R_{load} - U_{LN} \cdot R_{load})/U_{LN}$ $\Delta U_{LN} = U_0 - U_{LN}$ $R_{L1} = R_{load} \cdot (\Delta U_{LN} - \Delta U_N)/U_{LN}$ whereby $I_K$ is the short circuit current of the network $R_{L1}$ is the phase resistance of the L conductor $R_N$ is the phase resistance of the N conductor $R_{PE}$ is the phase resistance of the PE conductor $R_{load}$ is the load resistance for loading the network $U_0$ is the network no-load voltage $U_{LN}$ is the network voltage under load $\Delta U_N$ is the voltage differential at the N conductor (loaded/unloaded)

$\Delta U_{LN}$ is the voltage differential in the network (loaded/unloaded)

As a second step, a constant current is fed with switch S1 in the open position via switch S2 into the PE conductor (RPE) At 5 mA, this constant current is below the trigger current of a fault current circuit breaker. The constant current hereby causes a voltage drop $U_{PE}$ across $R_{PE}$. This voltage drop can be measured with a high resistance via the N conductor ($R_N$).

The PE resistance is hereby found as:

$$R_{PE}=U_{PE}/\text{Im}$$

The following applies to the loop resistance $R_S$:

$$R_S=R_{PE}+R_{L1}$$

A big advantage of the previously described method is that all resistances occurring in the network can be recorded, something which is also of great interest for future developments.

Figure 2:
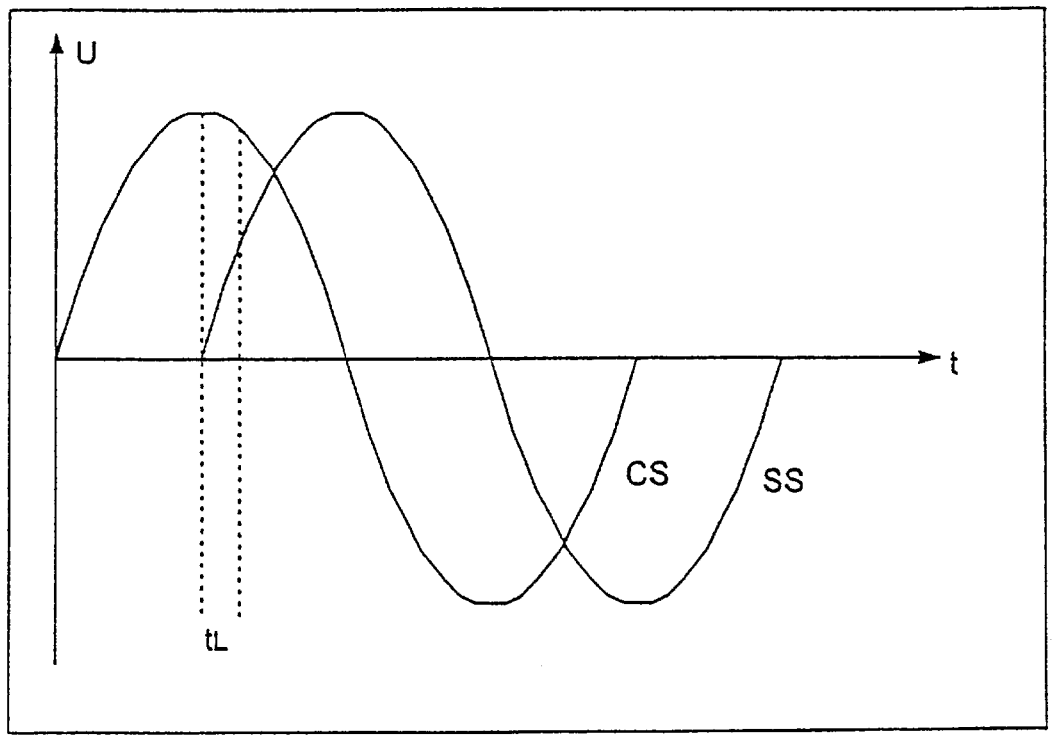
FIG. 2 shows a time-voltage diagram for explaining the second variant of the method according to the invention.

The second variant of the method according to the invention is now explained in more detail in reference to FIG. 2.

The L1-PE loop is energized with a sufficiently high load, i.e., beginning in the cross-over of the network sinus voltage SS (see FIG. 2). After a certain time, which is short enough to avoid the triggering of a fault current circuit breaker, the load is again switched off; i.e., the load interval $t_L$ is ended.

A parallel-working differentiator forms a differential from the network sinus voltage SS, i.e., a cosinus voltage CS correlating with it. Both voltages SS and CS are sensed and stored simultaneously within the load interval $t_L$ at a certain time t, either digitally or analogously.

According to the formula:

$$\text{generally } \sin^2 x+\cos^2 x=1 \text{ and} \qquad (3)$$

$$\text{specifically } SS^2(t)+CS^2(t)=U2_{load}$$

the peak value $U2_{load}$ of the network voltage is determined in the loaded state, without requiring the network voltage to be loaded over the entire half-wave. The calculation can be performed analogously by multiplication and addition, or digitally, e.g., controlled by a microcontroller.

The peak value of the unloaded network voltage U1 is determined with a peak value rectifier.

Using the values determined in such a way, the equation $R_S=dU/dI \approx (U1-U2)/(I1-I2)$ is used to determine the sought peak resistance, whereby I2=calculated load current ($U2_{load}/R_{load}$).

The following again lists the terms used in this application:

$U_0$ no-load voltage of the network (between L1-N)

$U_{LN}$ network voltage under load (between L1-N)

$\Delta U_{LN}$ voltage differential of the loaded/unloaded network (between L1-N)

$I_K$ short circuit current of the network (between L1-N)

$I_M$ input constant current (between L1-PE)

$\Delta U_N$ voltage differential at the N conductor (between N-PE)

$U_{PE}$ voltage drop at the PE conductor because of IM (between N-PE)

$R_{L1}$ phase resistance of the L conductor $R_N$ phase resistance of the N conductor $R_{PE}$ phase resistance of the PE conductor $R_{load}$ load resistance for loading the network $R_S$ loop resistance $t_L$ load interval t sensing time $U_1$ network voltage, UNloaded (between L1-PE)

$U_{2load}$ network voltage, loaded (between L1-PE)

$I_1$ zero current without load $I_2$ load current

What is claimed is:

1. A method for determining a loop resistance of a power supply network having a neutral conductor (N), an external conductor (L1), a protective earth conductor (PE), and a fault current circuit breaker (FI) for breaking the L1 and N conductors based on a magnitude of a current in the PE conductor, comprising the following steps:

connecting a load resistance $R_{load}$ between the L1 conductor and the N conductor thereby loading a network loop L1-N; and determining a phase resistance $R_L 1$ of the external conductor (L1) according to the equation, $$R_{L1}=R_{load} \cdot (\Delta U_{LN}-\Delta U_N)/U_{LN}$$

wherein $\Delta U_{LN}$=a magnitude of a voltage differential between a first voltage between L1 and N with the load resistance present and a second voltage between L1 and N without the load resistance present;

$U_{LN}$=a network voltage between L1 and N when the load resistance is present;

$\Delta U_N$=a voltage differential between the N and PE conductors;

applying a measuring current $I_M$ to a network loop comprising the L1 and PE conductors, wherein said measuring current is small enough to avoid triggering the fault current circuit breaker, and determining a phase resistance $R_{PE}$ of the protective earth conductor (PE) according to the equation:

$$R_{PE}=U_{PE}/I_M$$

wherein $U_{PE}$ is a voltage drop between the N and PE conductors and determining a loop resistance of an L1-PE loop as the sum of an internal resistance of the L1 conductor $R_{L1}$, and the phase resistance $R_{PE}$.

2. Method as claimed in claim 1, wherein the measuring current $I_M$ is in the magnitude of milliamperes and is in particular approximately 5 mA.

3. Method as claimed in claim 1, wherein the measuring current $I_M$ is a direct current.

4. Method as claimed in claim 1, wherein the measuring current $I_M$ is an alternating current.

5. Method as claimed in claim 3, wherein the measuring current $I_M$ is taken from an external power supply.

6. Method as claimed in claim 3, wherein the measuring current $I_M$ is taken from the power supply network.

7. A method for determining a loop resistance of an alternating current power supply network having a neutral conductor (N), a phase or external conductor (L1), a ground or protective earth conductor (PE), and a fault current breaker (FI) for breaking the L1 and N conductors based on a magnitude of a current in the PE conductor, based on a differential quotient $$RS=dU/dI\approx(U1-U2)/(I1-I2);$$

and $$I2=U_{2load}/R_{load}$$

wherein U1 is a measured, unloaded network voltage, I1 is a zero current without load, $U2_{load}$ is a measured, loaded network voltage, and I2 is a calculated load current, comprising the following steps:

connecting a load impedance between the L1 conductor and the N conductor thereby loading a network L1-PE loop during a predetermined time interval $t_L$ of a network sinus voltage (SS) which is small enough to avoid triggering of the fault current breaker, forming a differential of the network sinus voltage in the form of a cosinus voltage (CS) that correlates with said sinus voltage, and sensing and storing said voltages SS and CS at a time t during the predetermined time interval, determining a peak value of the unloaded network voltage U1, determining a peak value U2 of the loaded network voltage according to the equation:

$$SS^2(t)+CS^2(t)=U2_{load}$$

and determining the loop resistance Rs.

8. Method as claimed in claim 7, wherein the sensing and storage of the voltages SS and CS is performed digitally.

9. Method as claimed in claim 7, wherein the L1-PE loop is loaded started with the cross-over of SS.

10. Method as claimed in claim 7, wherein sensing and storage of the voltages SS and CS is performed analogously.

11. Method as claimed in claim 1, wherein calculations are performed using analog adders and multipliers.

12. Method as claimed in claim 1, wherein calculations are performed digitally, controlled by a microprocessor.

13. Method as claimed in claim 7, wherein calculations are performed using analog adders and multipliers.

14. Method as claimed in claim 7, wherein calculations are performed digitally, controlled by a microprocessor.

* * * * *

UNITED STATES PATENT AND TRADEMARK OFFICE
CERTIFICATE OF CORRECTION

PATENT NO.    : 6,288,553 B1
DATED         : September 11, 2001
INVENTOR(S)   : Christoph Hofstetter and Frank Henninger Page 1 of 1

It is certified that error appears in the above-identified patent and that said Letters Patent is hereby corrected as shown below:

Claim 1,
Line 10, change "$R_L1$" to -- $R_{L1}$ --.

Column 7, claim 7,
Line 3, Equation, change "I1-12" to -- I1-I2 --.

Signed and Sealed this

Twenty-sixth Day of February, 2002

*Attest:*

*Attesting Officer*

JAMES E. ROGAN
*Director of the United States Patent and Trademark Office*